United States Patent [19]
Kamperschroer

[11] Patent Number: 6,121,754
[45] Date of Patent: Sep. 19, 2000

[54] METHOD FOR DISPLAYING A "LOW BATTERY" STATE IN ELECTRICAL EQUIPMENT WITH ELECTRICAL ENERGY STORES AND ELECTRICAL EQUIPMENT WITH ELECTRICAL ENERGY STORES WITH MEANS FOR DISPLAYING A "LOW BATTERY" STATE

[75] Inventor: Erich Kamperschroer, Dingden, Germany

[73] Assignee: Siemens Aktiengesellschaft, Munich, Germany

[21] Appl. No.: 09/077,708

[22] PCT Filed: Dec. 12, 1996

[86] PCT No.: PCT/DE96/02396

§ 371 Date: Jun. 5, 1998

§ 102(e) Date: Jun. 5, 1998

[87] PCT Pub. No.: WO97/22887

PCT Pub. Date: Jun. 26, 1997

[30] Foreign Application Priority Data

Dec. 15, 1995 [DE] Germany ............... 195 47 019

[51] Int. Cl.$^7$ ................................. H02J 7/00
[52] U.S. Cl. ........................... 320/132; 320/130
[58] Field of Search ................... 320/132, 134, 320/128, 130

[56] References Cited

U.S. PATENT DOCUMENTS

| | | | |
|---|---|---|---|
| 5,027,294 | 6/1991 | Fakruddin et al. | 320/136 |
| 5,043,651 | 8/1991 | Tamura | 320/136 |
| 5,166,623 | 11/1992 | Ganio | 320/134 |
| 5,432,452 | 7/1995 | Fiorina et al. | 320/151 |
| 5,455,499 | 10/1995 | Uskali et al. | 320/DIG. 21 |
| 5,721,482 | 2/1998 | Benvegar et al. | 320/106 |
| 5,949,217 | 9/1999 | Okada et al. | 320/132 |

FOREIGN PATENT DOCUMENTS

| | | |
|---|---|---|
| 0 555 012 A2 | 8/1993 | European Pat. Off. . |
| 0 566 264 A1 | 10/1993 | European Pat. Off. . |
| 38 18 034 A1 | 11/1989 | Germany . |
| 42 36 811 C1 | 1/1994 | Germany . |

OTHER PUBLICATIONS

Telecom Report 16, (1993) Heft 1, Schwerpunkt, Digitaler Komfort Für Schnurlose Telekommunikation, pp. 26 and 27.

Component 31 (1993) Heft 6, Stephan Althammer et al, Hochoptimierte ICS Für DECT–Schnurlostelefone, pp. 215–218.

Nachrichtentechnik Elektronik vol. 42 (Jan./Feb. 1992), No. 1, Berlin, Ulrich Pilger, Struktur Des DECT–Standards, pp. 23–29.

Philips Telecommunication Review, vol. 49, No. 3, Sep. 1991, R.J. Mulder, DECT, A Universal Cordless Access System, pp. 68–73.

Informatik–Spektrum (1991), vol. 14, No. 3, Berlin, A. Mann, Der GSM–Standard, Grundlage für digitale europäische Mobilfunknetze, pp. 137–152.

*Primary Examiner*—Peter S. Wong
*Assistant Examiner*—Lawrence Luk
*Attorney, Agent, or Firm*—Hill & Simpson

[57] ABSTRACT

In an electrical device, for example a cordless mobile part ($MT_{me}$), having an electrical energy store (AKK), for example a rechargeable battery or a battery, in order to indicate neither too early nor too late the "low energy store" state in the interest of utilizing the stored energy optimally and in a standard manner for various energy store types and/or different operating conditions of the energy store, use is made of the characteristic that the gradient at the "voltage knee" of a discharge voltage curve (ESK) of the energy store (AKK) is always the same, irrespective of the respective voltage level on the discharge voltage profile. In this case, at least one characteristic variable (STG, KRU)—for example the gradient, the curvature—is continually calculated in the form of an actual value (ISW, IKW) which indicates the characteristic variable in the discharge phase of the energy store. The calculation is in this case carried out, for example, by linear regression. If the actual value (ISW, IKW) is greater than a nominal value (SSW, SKW), then the "low energy store" state is signalled. This ensures that, irrespective of the nature of the energy store and the ambient temperature, the rechargeable battery and the mobile part ($MT_{me}$) always have approximately the same residual operating time.

17 Claims, 3 Drawing Sheets

METHOD FOR DISPLAYING A "LOW BATTERY" STATE IN ELECTRICAL EQUIPMENT WITH ELECTRICAL ENERGY STORES AND ELECTRICAL EQUIPMENT WITH ELECTRICAL ENERGY STORES WITH MEANS FOR DISPLAYING A "LOW BATTERY" STATE

BACKGROUND OF THE INVENTION

Electrical devices having electrical energy stores (for example batteries or rechargeable batteries) and means for indicating the "low energy store" state (for example a display, bell etc.) are, for example, mobile telecommunications devices (radios) which are based on the frequency and/or time-division multiplex method or the code-division multiplex method and are supplied with electrical power via rechargeable batteries or batteries.

For example, there are thus cordless mobile parts according to the DECT/GAP Standard (Digital European Cordless Telecommunication; see (1): Nachrichtentechnik Elektronik 42 [Telecommunications electronics 42] (1992, January/February/. No. 1, Berlin, DE; U. Pilger: "Struktur des DECT-Standards" [Structure of the DECT Standard], pages 23 to 29; (2): Philips Telecommunication Review, Vol. 49, No. 3, September 1991; R. Mulder: "DECT-Universal Cordless Access System", pages 68 to 73/Generic Access Profile; see ETSI Publication (prETS 300 444, April 1995, Final Draft, ETSI, FR) or mobile radio mobile parts to the GSM Standard (Groupe Spéciale Mobile or Global System for Mobile Communication; see Informatik Spektrum 14 [Information spectrum 14] (1991) June, No. 3, Berlin, DE; A. Mann: "Der GSM-Standard—Grundlage für digitale europäische Mobilfunknetze" [The GSM Standard—The basis of European digital mobile radio networks], pages 137 to 152).

Based on the document Components 31 (1993), Issue 6, pages 215 to 218; S. Althammer, D. Brüchmann: "Hochoptimierte IC's für DECT-Schnurlostelefone" [Highly optimized ICs for DECT cordless telephones], FIG. 1 shows the basic circuit design of a cordless mobile part MT which is used, for example, the Siemens "Gigaset 951/952" cordless telephone (see telcom report 16 (1993), Issue 1, pages 26 and 27).

The circuit design comprises a radio section FKT, a signal processing device SVE with a signal control section SST designed as a burst mode controller BMC, and a signal conversion section SUT designed as a Codec and AD/DA converter, a clock generator TG, a central controller ZS designed as a microcontroller μc, a BOF interface BSS to an operator interface BOF with a keypad TA, an indicating device AE, an earpiece HK, a microphone MF and a bell TRK as well as a power supply SV with a rechargeable battery (accumulator) AKK, which items are connected to one another in the illustrated manner. The principle of the method of operation of the circuit design is described, for example, in the documented cited above, Components 31 (1993), Issue 6, pages 215 to 218.

Instead of the rechargeable battery AKK, it is also possible to use a battery as an energy store for the cordless mobile part MT. When the stored energy is exhausted, in contrast to the rechargeable battery which is regenerated at the charging station LST, this battery is replaced by a new battery.

In order to charge the rechargeable battery AKK, the mobile part MT forms a functional unit with a charging station LST in such a manner that the rechargeable battery AKK of the mobile part MT is charged, for example, in accordance with the method known from WO94/10782.

If—after such charging—the mobile part MT has been in operation for a relatively long time period and, in consequence, the capacity of the rechargeable battery AKK is virtually exhausted, then—as is generally normal for electrical devices powered by rechargeable batteries—the "low battery" state is indicated. The indication can in this case be produced visually by displaying a rechargeable battery symbol on the indicating device (display) AE of the mobile part MT, and/or audibly by emitting a warning tone via the bell TRK of the mobile part MT. Both the display of the rechargeable battery symbol and the emission of the warning tone should be produced in good time for the user of the mobile part MT in this case so that the mobile part still has a residual operating time until the "rechargeable battery flat" state is reached, which residual operating time can be used by the user of the mobile part MT if required for message transmission (for example continuing a telephone call although the "low rechargeable battery" state is being indicated). On the other hand, neither the display of the rechargeable battery symbol nor the emission of the warning tone should be produced too early, since such premature indication can be misinterpreted by the user of the mobile part MT with regard to the overall operating time (for example overall call time) of the mobile part. It is therefore desirable to comply with an accurately dimensioned residual operating time of the mobile part MT (for example 10 minutes) which is acceptable for the user.

In order to satisfy the requirements quoted above, it is known—for example in the case of the Gigaset 951/952—for the "low rechargeable battery" state to be indicated when the rechargeable battery voltage supplied by the rechargeable battery AKK falls below a value of, for example, 1.15 V for a specified time. Undershooting the voltage value (1.15 V) for the specified time is defined by a voltage range.

Owing to the fact that the rechargeable battery packs have tight tolerances in terms of the rechargeable battery voltage, this procedure is sufficient in the case of mobile parts in which a plurality of rechargeable batteries AKK, so called rechargeable packs, are used.

However, if commercially available Mignon rechargeable batteries are used in the mobile part, it is no longer sufficient for the "low Mignon rechargeable battery" state to be indicated when the rechargeable battery voltage supplied by the Mignon rechargeable battery falls below a specified value $U_{LB}$ ($U_{Low\ Bat}$=voltage value U at which the "low rechargeable battery" state is indicated) using a $U_{LB}$ voltage range (undershooting of the voltage value $U_{LB}$ for a specified time). This situation is explained with reference to FIG. 2.

FIG. 2 shows three discharge voltage profiles ①, ②, ③ of Mignon rechargeable batteries from different manufacturers and three shaded areas ①, ②, ③ which are associated with the discharge voltage profiles ❶, ❷, ❸. The shaded areas ❶, ❷, ❸ represent residual operating times (for example residual call times), a first residual operating time RBZ1, a second residual operating time RBZ2 and a third residual operating time RBZ3, of the Mignon rechargeable batteries after the identification (indication) of the "low rechargeable battery" state. The first residual operating time RBZ1 is, for example, set optimally (precise dimensioning and acceptance of the user) for the rechargeable battery type ① (the $U_{LB}$ voltage range is passed through optimally with respect to time). The second residual operating time RBZ2 is too long, since, owing to the lower voltage level of the rechargeable battery type ②, the $U_{LB}$ voltage range is passed through too slowly. The third residual operating type RBZ3 is too short since, owing to the higher voltage level of the rechargeable battery type ③, the $U_{LB}$ voltage range is passed through too quickly.

The same effect occurs when a pack of rechargeable batteries (rechargeable battery pack) is discharged at different ambient temperatures, since the voltage level is very highly dependent on the temperature.

EP-0 555 012 A2 discloses a method for indicating the discharge level of energy stores (for example batteries or rechargeable batteries) in the case of which the object is to maximize the total amount of usable energy in the energy store before interruption of the supply connection between the energy store and the electrical device to be supplied (minimizing the remaining residual energy). The energy stores may be, for example, lithium, nickel-cadmium or metal-hybrid energy stores. In order to indicate the discharge level of the energy store, that charge state is determined which results from the change in the energy store voltage over time (calculation of the gradient dv/dt). In addition, it is also possible to determine the change in the gradient over time [calculation of the curvature d/dt(dv/dt)].

U.S. Pat. No. 5,166,623 discloses a method for indicating the discharge state of energy stores (batteries), in which, at predetermined times during the discharge phase of the energy store, a characteristic variable which indicates the gradient of a discharge curve of the energy store is in each case determined, in the form of a gradient-related actual value. After this, the gradients determined in this way are compared with one another. The "USED", "EMPTY", and "FULL" states are indicated depending on this comparison result, the "EMPTY" state, which is comparable with the "low energy store" state, being indicated if a determined gradient value is greater than a previously determined gradient value, or if the gradient has increased.

U.S. Pat. No. 5,432,452 and European reference 0 582 527 have disclosed an apparatus for identification of the failure of elements of a battery, in which the second derivative of the discharge voltage curve of the battery is compared with a threshold value. If this specified threshold value is exceeded, then an "elements of the battery have failed" indication is produced.

SUMMARY OF THE INVENTION

The object on which the invention is based is, in the case of electrical devices having a store for storing electrical energy (electrical energy store), to indicate the "low energy store" state neither too early nor too late, in the interest of utilizing the stored energy optimally and in a standard manner for various energy store types and/or different operating conditions of the energy store.

The present invention is a method and apparatus for indicating a "low energy store" state in electrical devices having electrical energy stores. During the discharge phase of the electrical energy store, a characteristic variable (which indicates the curvature of a discharge curve) of the energy store is determined in the form of a curvature-related actual value. The characteristic variable is determined by linear regression. A curvature-related nominal value is defined and the actual value is compared with the nominal value. The "low energy store" state is indicated if the actual value is less than/greater than the nominal value.

The idea on which the invention is based is that, in an electrical device, for example a cordless mobile part, having an electrical energy store, for example a rechargeable battery or a battery, to indicate the "low energy store" state neither too early nor too late, for example continual calculation of the curvature of the discharge voltage profile of the energy store in the form of an actual value, which indicates the curvature, in the discharge phase of the energy store and by comparison of the actual value with a nominal value. This ensures that, irrespective of the type of energy store, the voltage level, and the ambient temperature, the energy store (for example the rechargeable battery) and the electrical device (for example the cordless mobile part) always have approximately the same residual operating time. In addition, accurate knowledge of the discharge voltage profile of the energy store used in the device is unnecessary.

The calculation and comparison are carried out, preferably with software support, in a microcontroller in the electrical device. As an alternative, a hardware implementation is possible.

In the course of the calculation, use is made of the fact that the curvature at the "voltage knee" of a discharge voltage curve of the energy store is always the same, irrespective of the respective voltage level of the discharge voltage profile.

In order to avoid having to carry out the calculation over a relatively long time period, this calculation is, not started until the discharge voltage curve has fallen below a specified voltage value.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
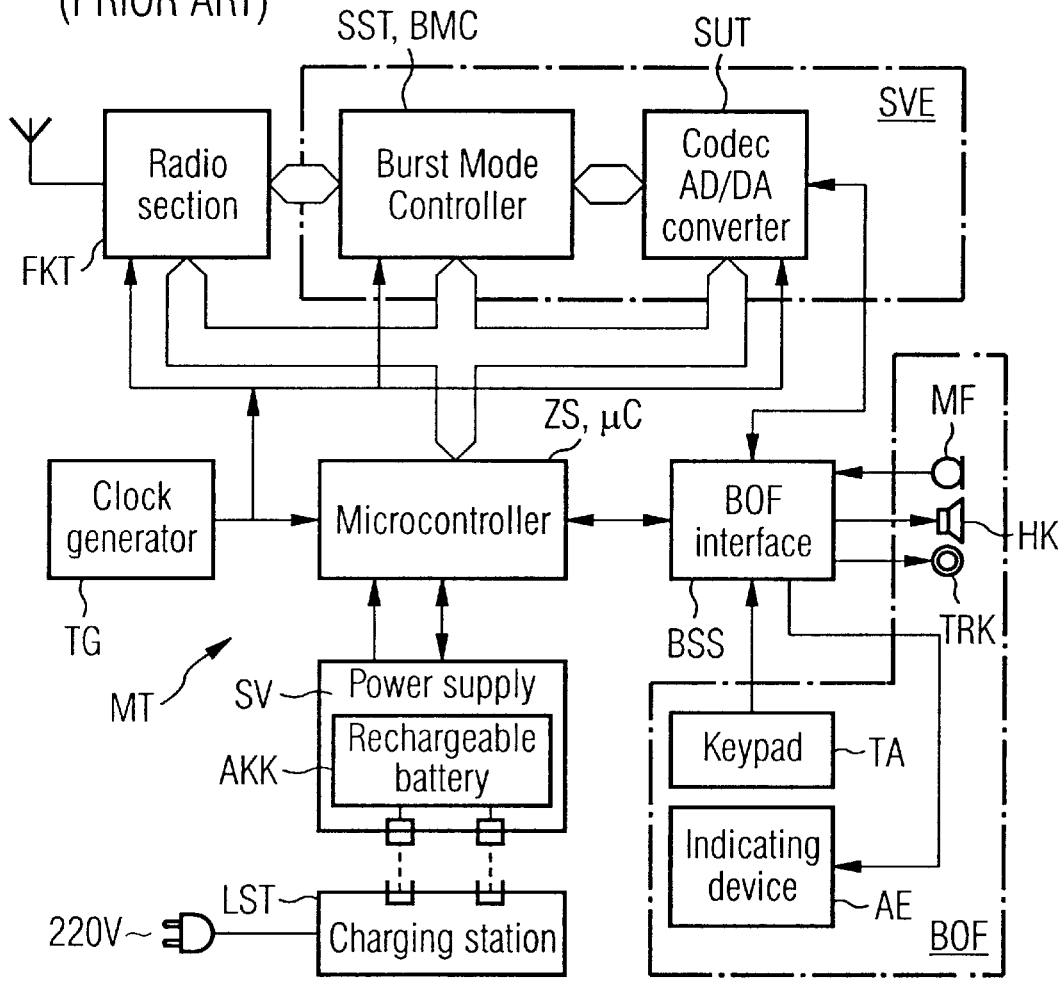
FIG. 1 depicts a prior art cordless mobile part.
Figure 3:
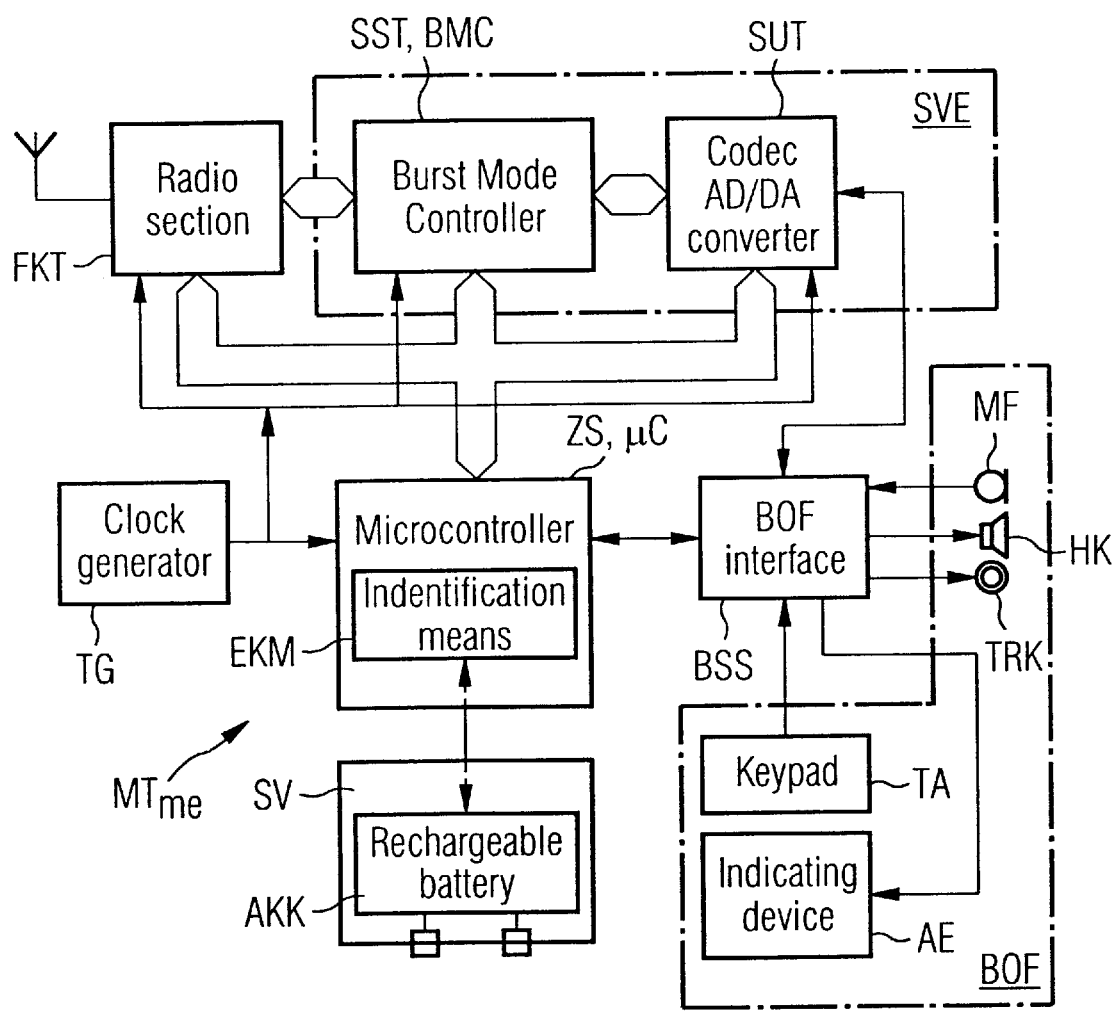
FIG. 3 is based on FIG. 1 and shows a modified, upgraded cordless mobile part with means for identifying the "low rechargeable battery" state.

Based on the cordless mobile part MT according to FIG. 1, FIG. 3 shows a modified, upgraded cordless mobile part $MT_{me}$, which has identification means EKM for identifying the "low rechargeable battery" state. The identification means EKM are contained in the central controller ZS and are bidirectionally connected to the rechargeable battery AKK via the link between the central controller ZS and the power supply SV.

Figure 4:
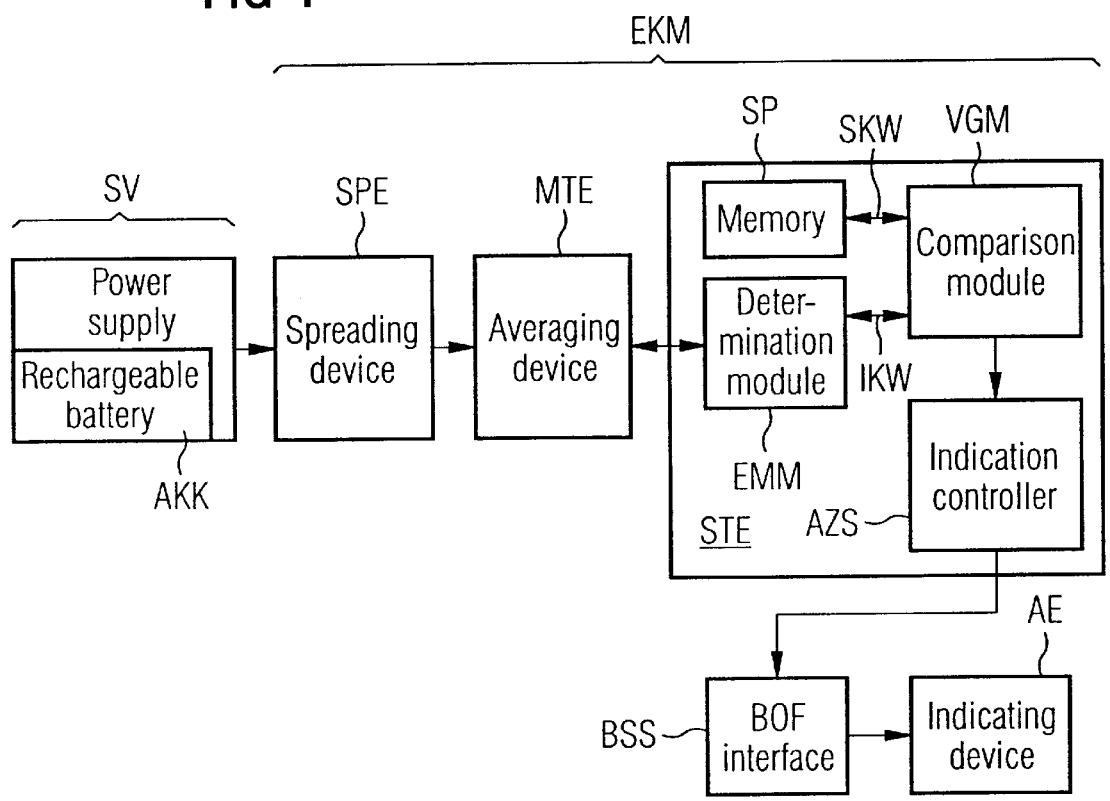
FIG. 4 shows the design of the identification means according to FIG. 3.

FIG. 4 shows the design of the identification means EKM according to FIG. 3. The identification means EKM in this case comprise a spreading device SPE (level shifter) connected downstream of the power supply SV, an averaging device MTE connected downstream of the spreading device SPE, and a control device STE connected downstream of the averaging device MTE. The actual identification of the "low rechargeable battery" state takes place in the control device STE. For this purpose, the control device STE has a determination module EMM, a comparison module VGM, a memory SP and an indication controller AZS. The way in which the identification means EKM operate will be explained in conjunction with FIG. 5.

Figure 2:
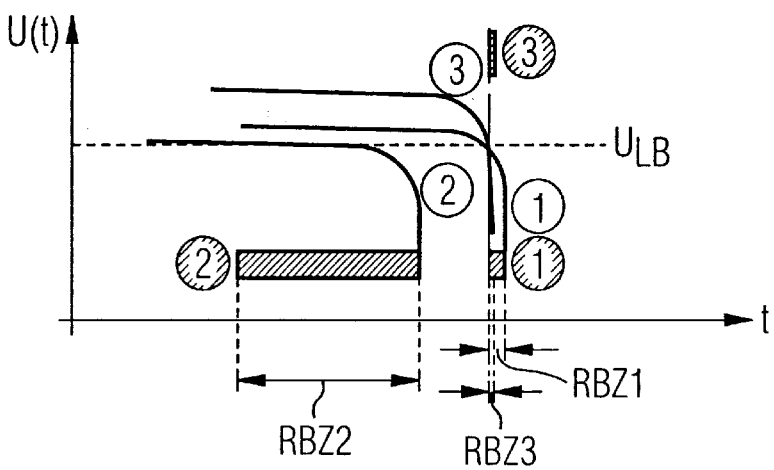
FIG. 2 depicts three discharge voltage profiles of prior art batteries.
Figure 5:
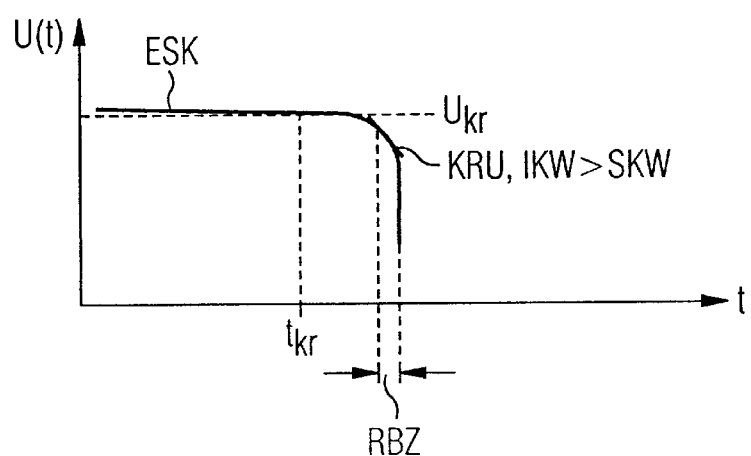
FIG. 5 shows a discharge voltage profile of the rechargeable battery according to FIG. 3.

Based on FIG. 2, FIG. 5 shows a discharge voltage curve ESK for the rechargeable battery AKK.

In order to identify the "low rechargeable battery" state, use is made of the characteristic that the curvature at the "voltage knee" of the discharge voltage curves according to FIGS. 2 and 5 is always the same, irrespective of the respective voltage level of the discharge voltage profile. In the process, current (instantaneous) curvatures KRU of the discharge voltage curves (characteristic variables of the discharge voltage curves) are calculated continuously (continually) in the discharge phases of the rechargeable batteries. The calculation is in this case carried out, for example, by means of linear regression. If the calculated curvature is greater than/less than a defined negative/positive value, then the "low rechargeable battery" state is signalled. This ensures that the rechargeable battery always has approximately the same residual operating time irrespective of the type of rechargeable battery and the ambient temperature.

The continual calculation, based on linear regression, of the curvature KRU of the discharge voltage curve ESK of the rechargeable battery AKK by the identification means EKM takes place, in detail, as follows:

The identification means EKM start to calculate the curvature KRU when a voltage value $U_{kr}$ is undershot at a time $t_{kr}$ in the discharge phase. The time $t_{kr}$ and the voltage value $U_{kr}$ are in this case chosen such that, for a discharge voltage curve ESK, with any value of x, for the rechargeable battery AKK the "voltage knee" of the discharge voltage curve ESK can always be evaluated by the curvature calculation. The aim is therefore to locate the starting time for calculation of the curvature KRU of the discharge voltage curve ESK as close as possible to the point on the discharge voltage curve ESK at which the "voltage knee" occurs. This has the advantage that the calculation is not carried out unnecessarily well before the voltage range that is actually of interest.

When the critical voltage value $U_{kr}$ is undershot, the voltage range of the discharge voltage curve ESK to be evaluated is spread with respect to the voltage values, by the spreading device SPE, in order to allow better evaluation of the discharge states of the rechargeable battery AKK. After this, analog/digital averaging is carried out in the averaging device MTE. The determination module EMM of the control device STE then calculates actual curvature values IKW, which it passes to the comparison module VGM. The comparison module VGM is also supplied with a nominal curvature value SKW, which is stored in the memory SP, so that the comparison module VGM can compare the two curvature values IKW, SKW with one Another.

If, from this comparison, the actual curvature value IKW is greater than/less than the nominal curvature value SKW, then the indicating device AE is activated by the indication controller AZS, via the BOF interface BSS, to indicate the "low rechargeable battery" state. With the indication of the "low rechargeable battery" state on the indicating device AE, the calculation of the curvature is terminated. In this case, the cordless mobile part $MT_{me}$ has a residual operating time RBZ which is always approximately the same, irrespective of the type of rechargeable battery AKK used, and thus irrespective of the respective discharge voltage curve ESK.

If, from this comparison, the actual curvature value IKW is less than/greater than the nominal curvature value SKW, then the calculation of the curvature is continued until the actual curvature value IKW is greater than/less than the nominal curvature value SKW.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for indicating a "low energy store" state in electrical devices having electrical energy stores, comprising the steps of:

determining by linear regression, during a discharge phase of the electrical energy store, a characteristic variable of the energy store;

calculating a curvature-related nominal value from the characteristic variable;

comparing the actual value with the nominal value;

indicating the "low energy store" state if the actual value differs from the nominal value.

2. The method as claimed in claim 1, wherein the characteristic variable is determined at regular time intervals.

3. The method as claimed in claim 1, wherein the characteristic variable is determined when a specified discharge curve value is undershot, the discharge curve value being specified such that a time at which the discharge curve value is undershot is approximately a time at which a "voltage knee" occurs in the discharge curve.

4. The method as claimed in claim 1, wherein the method is utilized in an electrical device having a rechargeable battery as the electrical energy store.

5. The method as claimed in claim 1, wherein the method is utilized in an electrical device having a battery as the electrical energy store.

6. The method as claimed in claim 1, wherein the method is utilized in a cordless mobile part.

7. An electrical device having an electrical energy store for indicating a "low energy store" state, comprising:

first means for determining data which, during a discharge phase of the electrical energy store, determine a characteristic variable of the energy store as a curvature-related actual value;

the first means determining the characteristic variable by linear regression;

a memory in which a specified, curvature-related nominal value is stored;

second means for comparison of data, which are connected to the first means and to the memory and compare the actual value with the nominal value;

third means for indicating data, which are connected to the second means and to an indicating device and which indicate the "low energy store" state whenever the actual value differs from the nominal value (SKW).

8. The electrical device as claimed in claim 7, wherein, the first means, the second means and the third means and the memory are integrated and implemented in a microcontroller.

9. The electrical device as claimed in claim 7, wherein the first means determines the characteristic variable at regular time intervals.

10. The electrical device as claimed in claim 7, wherein the first means determines the characteristic variable when a predetermined discharge curve value is undershot, the discharge curve value being specified such that a time at which the discharge curve value is undershot is in a vicinity of a time at which a "voltage knee" occurs in the discharge curve.

11. The electrical device as claimed in claim 7, wherein the electrical energy store is a rechargeable battery.

12. The electrical device as claimed in claim 7, wherein the electrical energy store is a battery.

13. The electrical device as claimed in claim 7, wherein the electrical device is a cordless mobile part.

14. The electrical device as claimed in claim 1, wherein the actual value is less than the nominal value.

15. The electrical device as claimed in claim 1, wherein the actual value is greater than the nominal value.

16. The electrical device as claimed in claim 7, wherein the actual value is less than the nominal value.

17. The electrical device as claimed in claim 7, wherein the actual value is greater than the nominal value.

\* \* \* \* \*